(12) United States Patent
Grieser et al.

(10) Patent No.: US 6,723,385 B1
(45) Date of Patent: Apr. 20, 2004

(54) PROCESS FOR THE PRELIMINARY TREATMENT OF COPPER SURFACES

(75) Inventors: Udo Grieser, Berlin (DE); Heinrich Meyer, Berlin (DE); Uwe Hauf, State College, PA (US)

(73) Assignee: Atotech Deutschland GmbH (DE)

( * ) Notice: Subject to any disclaimer, the term of this patent is extended or adjusted under 35 U.S.C. 154(b) by 0 days.

(21) Appl. No.: 10/129,705

(22) PCT Filed: Jan. 25, 1999

(86) PCT No.: PCT/DE99/00244

§ 371 (c)(1),
(2), (4) Date: Sep. 5, 2000

(87) PCT Pub. No.: WO99/40765

PCT Pub. Date: Aug. 12, 1999

(65) Prior Publication Data (65)

(30) Foreign Application Priority Data

Feb. 3, 1998 (DE) .......................................... 198 06 190
Jun. 26, 1998 (DE) .......................................... 198 30 037

(51) Int. Cl.[7] .............................. B05D 3/00; C23C 8/00; C23C 22/48; C23C 1/02
(52) U.S. Cl. ..................... 427/307; 427/327; 148/240; 148/270; 134/3
(58) Field of Search ................................ 148/240, 270; 216/105, 13; 134/3; 427/307, 327, 58; 252/79.4, 79.2; 106/14.13, 14.16, 14.21

(56) References Cited

U.S. PATENT DOCUMENTS

| | | | |
|---|---|---|---|
| 3,645,772 A | | 2/1972 | Jones |
| 3,770,530 A | | 11/1973 | Fujimoto |
| 4,051,057 A | | 9/1977 | Ericson et al. |
| 4,140,646 A | | 2/1979 | Kent |
| 4,158,593 A | | 6/1979 | Allan et al. |
| 4,374,744 A | | 2/1983 | Kawanabe et al. |
| 4,917,758 A | | 4/1990 | Ishizuka |
| 5,800,859 A | * | 9/1998 | Price et al. ................... 427/98 |
| 5,869,130 A | * | 2/1999 | Ferrier ........................ 427/98 |
| 6,036,758 A | * | 3/2000 | Fairweather ............. 106/14.44 |
| 6,506,314 B1 | * | 1/2003 | Whitney et al. ............ 216/100 |

FOREIGN PATENT DOCUMENTS

| | | |
|---|---|---|
| EP | 0 670 379 A | 9/1995 |
| JP | 06-57453 | 6/1994 |
| JP | 08-0097599 | 4/1996 |
| WO | PCT/GB95/02909 | 6/1996 |

OTHER PUBLICATIONS

Search report issued out of Austrian Patent Office on Singapore Patent Application No. SG 9903080–1.

* cited by examiner

Primary Examiner—Brian K. Talbot
(74) Attorney, Agent, or Firm—Paul & Paul

(57) ABSTRACT

A process to pretreat copper surfaces for tight bonding to organic substrates as those found in multilayer printed circuit boards includes first treating the copper with a solution containing hydrogen peroxide, and at least one acid, and at least one nitrogen-containing five-member heterocyclic compound which does not contain sulfur, selenium or tellurium atoms in the heterocycle. Thereafter the copper surfaces are brought into contact with a second solution containing at least one adhesion-promoting compound from the group consisting of sufinic acid, selinic acid, telluric acid, and heterocyclic compounds that contain at least one sulfur, and/or selenium and/or tellurium atom in the heterocycie and also sulfonium, selenonium and telluronium salts.

19 Claims, No Drawings

PROCESS FOR THE PRELIMINARY TREATMENT OF COPPER SURFACES

This application is a 371 of PCT/DE99/00244, filed Jan. 25, 1999.

The invention concerns a process to pretreat copper surfaces so that a tight bond can be subsequently formed between the pretreated copper surfaces and plastic substrates. The solution preferably serves to pretreat the inner layers of printed circuit boards with copper coatings to subsequently allow a tight bond between the inner layers of the printed circuit board and inner layers of the board made of resin, and to pretreat printed circuit boards with copper layers to create a tight bond between the copper layers and plastic resists.

In manufacturing printed circuit boards, various steps are carried out in which copper surfaces must be tightly bonded to an organic substrate. In some cases, the required adhesion of the formed bonds must be ensured over a long period. In other cases, a tight bond only has to exist for a short period, e.g. when the organic substrate only remains on the copper surfaces during manufacture of the printed circuit board. For example, the tight bond of dry film resists (for structuring conductor lines on printed circuit boards) to the copper surfaces only has to exist while manufacturing the printed circuit board. After the conductor line structures are formed, the resists can be removed.

The easiest way to increase the adhesion is to etch and hence roughen the copper surfaces before forming the bond. Microetching solutions are used such as sulfuric acid solutions of hydrogen peroxide or sodium peroxodisulfate.

Another procedure is described in U.S. Pat. No. 3,645,772. A pretreatment solution is used for the copper surfaces that e.g. contains 5-aminotetrazole.

Long-term stability is necessary especially when laminating multilayer printed circuit boards. Other treatments for the copper surfaces are required in this case.

When manufacturing multilayer boards, several inner layers are laminated with insulating resin layers (so-called prepregs: epoxide resin films reinforced with fiberglass nets). The inner bonds of the laminate must be retained throughout the entire life of the printed circuit board. The copper layers (preferably the conductor line structures) on the inner layers must be surface-treated. Various procedures have been developed to solve this problem.

The procedure normally used to pretreat the materials before lamination is to form an oxide layer on the copper surfaces. In this process known as the brown or black oxide process, very aggressive reaction conditions are used to form the oxide. A disadvantage of this procedure is that the oxide layer used for enhancing adhesion to the resin layer is not very resistant to acid and especially to hydrochloric treatment solutions. They are hence attacked in subsequent processes to plate the through holes in the boards, and the adhesive bond is eliminated with delamination at the attacked sites (pink ring: An externally-visible attack on the black oxide layer directly next to a hole in printed circuit boards with the discoloration of the originally black oxide layer. The pink copper coating of the inner layer is recognizable as an annular defect; wedge void: A defect (recognizable in a micrograph of a treated hole) in a printed circuit board in the form of a crack between a copper inner layer and the neighboring printed circuit board resin from the attack of acid treatment solutions on the black oxide layer).

The above-cited problem is solved by reducing the oxide layer surface before lamination. The reduced black oxide is more stable than normal black oxide against chemicals used in plating the through-holes. The additional reduction step costs a great deal, however. In addition, the chemicals used for reduction are not very resistant to oxidation from air, so that the life time of the baths and storage life of the supplementary chemicals are limited. An attempt to eliminate this problem is made in JP A 08097559 by providing the reduced copper oxide layers with a protective layer by treating them with an aqueous solution containing an aminothiazole and/or aminobenzothiazole compound. However, the problems of expensive reduction chemicals, low resistance to oxidation and the layer's sensitivity to acid are not completely eliminated.

Another option for promoting adhesion is to treat the copper surfaces with an aqueous or alcoholic solution of an azole compound. Such a procedure is e.g. presented in WO 96/19097 A1. The copper surfaces are treated with a solution that contains 0.1–20 weight percent hydrogen peroxide, an inorganic acid (e.g. sulfuric acid), an organic corrosion inhibitor (e.g. benzotrizole), and a wetting agent. The hydrogen peroxide etches the copper surface to produce microrough surfaces.

U.S. Pat. No. 4,917,758 discloses etching solutions that serve to etch copper cladding on the materials of the printed circuit board. Hydrogen peroxide, sulfuric acid and a nitrogen-containing compound (preferably amino benzoic acid, amino tetrazole or phenyl urea) are also in these solutions.

The present invention is therefore based on the problem of avoiding the disadvantages of the state of the art and finding a pretreatment process that can create a bond between the copper surfaces and plastic surfaces with excellent adhesion. The process shall be simple, easy to use, and inexpensive. In addition, the treatment solutions shall not precipitate. It is also important that treatment with the solutions produces a material bond that is not problematic (no pink ring and wedge voids) in the subsequent processes for manufacturing printed circuit boards, e.g. plating through holes in board materials. The used pretreatment solutions shall therefore be suitable for manufacturing printed circuit boards.

This problem is solved by the process found in claim 1.

The process according to the invention is for pretreating copper surfaces to allow a tight bond to be formed with plastic substrates. The substrates with the copper surfaces, e.g. copper films or resin laminates coated with copper films, are brought into contact with a first solution that contains the following components:

a. Hydrogen peroxide,
b. At least one acid, and
c. At least one nitrogen-containing, five-member heterocyclic compound that does not contain sulfur, selenium or tellurium atoms in the heterocycle.

Then the substrates with the copper surfaces are brought into contact with a second solution that has at least one adhesion-promoting compound from the group consisting of sulfinic acid, selenic acid, telluric acid, heterocyclic compounds that contain at least one sulfur, selenium and/or tellurium atom in the heterocycle, as well as sulfonium, selenonium and telluronium salts. The sulfonium, selenonium and telluronium salts are compounds of general formula

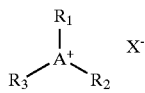

A where A=S, Se or Te,

R$_1$, R$_2$ and R$_3$=alkyl, substituted alkyl, alkenyl, phenyl, substituted phenyl, benzyl, cycloalkyl, substituted cycloalkyl, where R$_1$, R$_2$ and R$_3$ are the same or different, and X$^-$=Anion of an inorganic or organic acid or hydroxide.

Adhesion-promoting compounds are to be selected that are sufficiently soluble in the acidic, preferably sulfuric acid solution.

The problem on which the invention is based is solved by the optional uses in claims 18 and 19. The process according to the invention is useful preferably in pretreating copper-layer-coated inner layers of printed circuit boards to allow a tight bond to be formed between the inner layers of the printed circuit boards and plastic resin layers, and to pretreat printed circuit boards with copper layers so that a tight bond can be formed between the copper layers and plastics resists.

Preferred embodiments of the invention are found in the subclaims.

Preferred sulfinic acids in the second solution are adhesion-promoting compounds with chemical formula B:

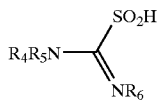

B with R$_4$, R$_5$ and R$_6$=hydrogen, alkyl, substituted alkyl, phenyl, substituted phenyl or R$_7$—(CO)— with R$_7$=hydrogen, alkyl, substituted alkyl, phenyl, substituted phenyl, where R$_4$, R$_5$ and R$_6$ are the same or different, and aromatic sulfinic acids.

It is preferable for the second solution to contain formamidine sulfinic acid as the adhesion-promoting compound. Preferable aromatic sulfinic acids are benzene sulfinic acid, toluene sulfinic acids, chlorobenzene sulfinic acids, nitrobenzene sulfinic acids and carboxybenzene sulfinic acids.

Preferable adhesion-promoting heterocyclic compounds are thiophene, thiazole, isothiazole, thiadiazole and thiatriazole.

Suitable thiophenes are compounds of chemical formula C:

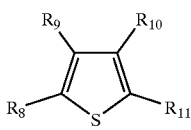

C with R$_8$, R$_9$, R$_{10}$, R$_{11}$=hydrogen, alkyl, substituted alkyl, phenyl, substituted phenyl, halogen, amino, alkylamino, dialkylamino, hydroxy, alkoxy, carboxy, carboxyalkyl, alkoxycarbonyl, aminocarbonyl, R$_{12}$—CONH— with R$_{12}$=hydrogen, alkyl, substituted alkyl, phenyl or substituted phenyl, where R$_8$, R$_9$, R$_{10}$ and R$_{11}$ are the same or different, and can be a part of the homo or heterocyclic rings condensed to the thiophene ring.

Particularly preferred thiophenes are aminothiophene carboxylic acids, their esters and amides. For example, 3-aminothiophene-2-carboxylic acid methyl ester can be advantageously used.

Suitable thiazoles are compounds of chemical formula D:

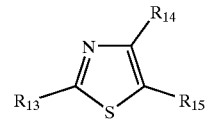

D with R$_{13}$, R$_{14}$, R$_{15}$=hydrogen, alkyl, substituted alkyl, phenyl, substituted phenyl, halogen, amino, alkylamino, dialkylamino, hydroxy, alkoxy, carboxy, carboxyalkyl, alkoxycarbonyl, aminocarbonyl, R$_{16}$—CONH— with R$_{16}$=hydrogen, alkyl, substituted alkyl, phenyl or substituted phenyl, where R$_{13}$, R$_{14}$ and R$_{15}$ are the same or different, and can be part of the homo or heterocyclic ring condensed to the thiazole ring.

Particularly suitable thiazoles are aminothiazole and substituted aminothiazole. Other preferred thiadiazole adhesion-promoting compounds are from the group of aminothiadiazoles and substituted aminothiadiazoles.

In addition, the preferred sulfonium salts used as adhesion-promoting compounds in the second solution are trimethylsulfonium, triphenylsulfonium, methionine alkylsulfonium and methionine benzylsulfonium salts.

Other components are in the second solution beyond the cited compounds. Like the first solution, it is preferable for the second solution to contain an acid, preferably and inorganic acid, and especially sulfuric acid. In addition, copper ions can be in the second solution that e.g. can arise by the dissolution of copper at the treated copper surfaces.

In addition to hydrogen peroxide and an acid, the first solution contains five-member heterocyclic compounds containing nitrogen but no sulfur, selenium or tellurium atom in the heterocycle. Monocyclic and polycyclic condensed ring systems can be used as the heterocyclic compounds. For example, the compounds can contain an anellated benzene, naphthalene or pyrimidine ring. When selecting these compounds, make sure that they are sufficiently soluble in the acid solution. It is preferable for the solution to contain triazoles, tetrazoles, imidazoles, pyrazoles and purines or their derivatives.

In particular, the first solution contains triazoles of chemical formula E1 as the heterocyclic compound:

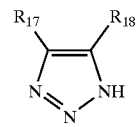

E1 with R$_{17}$, R$_{18}$=hydrogen, alkyl, substituted alkyl, amino, phenyl, substituted phenyl, carboxyalkyl, where R$_{17}$ and R$_{18}$ are the same or different, or part of a homo or heterocyclic ring condensed to the triazole ring.

Particularly preferable heterocyclic compounds in the first solution are benzotriazole, methylbenzotriazole, ethylbenzotriazole and dimethylbenzotriazole.

In addition, the first solution can contain tetrazoles with chemical formula E2 as the adhesion-promoting compounds:

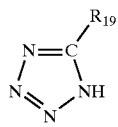

with $R_{19}$=hydrogen, alkyl, substituted alkyl, halogenalkyl, amino, phenyl, substituted phenyl, benzyl, carboxy, carboxyalkyl, alkoxycarbonyl, aminocarbonyl or $R_{20}$—CONH with $R_{20}$=hydrogen, alkyl, substituted alkyl, phenyl or substituted phenyl.

Preferred tetrazole compounds are 5-aminotetrazole and 5-phenyltetrazole. A preferred imidazole is benzimidazole. 5-aminotetrazole, 5-phenyltetrazole, benzotriazole, methylbenzotriazole and ethylbenzotriazole are particularly preferred compounds given their favorable solubility in the first treatment solution and their availability.

Preferred combinations are benzotriazole, methylbenzotriazole, ethylbenzotriazole, 5-aminotetrazole and 5-phenyltetrazole as the nitrogen-containing, five-member heterocyclic compounds in the first solution, with aminothiophene carboxylic acids, their esters and amides, aminothiazole and substituted aminothiazoles as the heterocyclic compounds in the second solution.

In addition, the first solution generally contains copper ions that form from etching the copper surfaces and are enriched in the solution.

The process according to the invention is an extremely easy way to pretreat copper surfaces to provide a tight bond with plastics. Essentially, two steps are necessary, i.e., treating the copper surface with the two solutions according to the invention to provide a bond to organic substrates. The adhesion does not decrease even after a long time.

If the nitrogen-containing, heterocyclic compounds are not in the first solution or if the adhesion-promoting compounds are not in the second solution, the strength of the bond will not be close. In addition, the long-term stability of the bond after being treated with solutions that do not contain the adhesion-promoting compounds according to the invention is substantially lower than when solutions are used that contain the adhesion-promoting compounds.

In addition, the problems that arise in conjunction with plating through-holes in the printed circuit boards, i.e., the formation of pink ring and wedge voids, is avoided by using these additional compounds in the treatment solutions since the adhesion-promoting layers created using the procedure according to the invention have an excellent acid resistance, whereas black oxide and reduced black oxide layers are somewhat sensitive to hydrochloric acid solutions. It has even been shown that the adhesion of a bond to organic substrates can be improved in certain cases when the copper surfaces are treated with diluted acid after being treated using the process according to the invention and before the bond is created. Hydrochloric acid is preferably used for this. In addition, the procedure is largely free of precipitation.

The advantageous effect of the process according to the invention was surprising since the desired long-term adhesion is not produced when just the adhesion-promoting compounds are used in one of the treatment solutions without using the nitrogen-containing, five-member heterocyclic compounds in the other solution. When the nitrogen-containing, five-member heterocyclic compounds are used along with the adhesion-promoting compounds, the copper surfaces change color and the desired results are produced.

The copper surfaces should first be cleaned for the pretreatment to be most effective. Any conventional cleaning solution can be used. Normally, wetting agents and sometimes complexer (such as triethanol amine)-containing aqueous solutions are used.

After rinsing the cleaned copper surfaces, they can be brought into contact with a so-called predippping solution that contains one of the five-member heterocyclic compounds (component c) dissolved in water, preferably at a concentration of 0.1–10 g/l, and especially 0.5–2 g/l. This treatment helps the adhesion-promoting layer to be formed in the subsequent treatment step. In particular, any delays in the formation of the layer are avoided. The layer starts forming directly when the surface contacts the solution from the invention.

Then the surfaces are treated with the first solution according to the invention containing components a, b and c without being rinsed. The substrates can then be rinsed to remove any adhering liquid from the substrate. Subsequently, the surface is treated with second solution according to the invention. The copper surfaces can also be treated with the second solution directly after being treated with the first solution without be rinsed.

With this treatment, the copper surfaces change color from pink to brown as an adhesion-promoting layer is formed depending on the combination of nitrogen-containing, five-member heterocycle in the first solution and adhesion-promoting compounds in the second solution.

The microetching of the hydrogen peroxide in connection with the acid yields microrough copper surfaces. Since this increases the surface area, the adhesion of the bond subsequently formed between the copper surfaces and the plastic substrate also increases. The change in color of the surface during treatment is caused by a thin copper oxide layer. It is also suspected that adhesion of the subsequently formed bond is also improved by the formation of a copper organic compound that probably forms on the copper surface from copper or copper oxide, the nitrogen-containing compound, and the adhesion-promoting compound. It is preferable for the acid in the solution according to the invention to be an inorganic acid, and especially sulfuric acid. Other acids can of course also be used.

It is preferable for the acid in the first solution to be an inorganic acid, especially sulfuric acid. Of course other acids can be used.

To stabilize hydrogen peroxide against decomposition, other additionalcompounds can be used in the first solution such as p-phenolsulfonic acid.

Both solutions can contain solvents such as water and additional other organic solvents like alcohols, e.g. to increase the solubility of the contained components, especially the nitrogen-containing, five-member heterocyclic compounds and the adhesion-promoting compounds.

In addition, other inorganic and organic compounds can be in the solutions, e.g., wetting agents. Copper sulfate can also be in the second solution.

The treatment with the two solutions is preferably carried out at 20–60° C. The treatment time is preferably 10–600 sec. The higher the temperature, the faster-acting the solution. The treatment times may hence be even much shorter. From a practical standpoint, an average temperature is preferably selected such as 35–45° C. to better control the reaction. Average treatment times are 20–90 sec. In addition, a top temperature limit may have to be set due to possible incompatibilities between certain components in the solution at high temperatures, e.g., wetting agents that dissolve with difficulty at high temperatures.

The preferable concentration ranges in the solutions are:

| First solution: | |
| --- | --- |
| Sulfuric acid, conc. | 10–250 g/l |
| Hydrogen peroxide, 30 weight percent | 1–100 g/l |
| Five-member, nitrogen-containing heterocyclic compound | 0.5–50 g/l |
| Second solution: | |
| Sulfuric acid, conc. | 10–250 g/l |
| Adhesion-promoting compounds: | |
| Sulfinic, selenic and/or telluric acid | 0.05–10 g/l |
| adhesion-promoting heterocyclic compound | 0.05–20 g/l |
| Sulfonium, selenonium and/or telluronium salt | 0.01–10 g/l |

The optimum concentrations for the cited bath components depend on the type of nitrogen-containing heterocyclic compounds and adhesion-promoting compounds.

After they are treated using the procedure from the invention, the copper surfaces are rinsed, preferably with warm, deionized water. Then they are dried, e.g. with hot air.

Optionally, the copper surfaces can also be treated with diluted acid after being rinsed, preferably with 10 weight percent hydrochloric acid or 10 weight percent sulfuric acid. Treatment times of 5–300 sec. are useful. After being treated with acid, the copper surfaces are again rinsed, preferably with deionized water.

To increase the storage life of the solutions of the invention, it is a good idea to prepare the ready-for-use treatment solutions right before carrying out the procedure. For example, the first solution can be created by mixing hydrogen peroxide with a sulfuric acid solution of the nitrogen-containing heterocyclic compound, or a prepared solution can be supplemented directly before use to reach the desired concentrations of individual components.

The workpieces with the copper surfaces can be treated in conventional dipping machines. In treating the printed circuit boards, it has proven to be particularly good to use so-called continuous systems. The boards are guided along a horizontal transport path through the system and brought into contact with the treatment solutions by guiding them through a liquid bed between squeezing rollers at the beginning and end of the treatment path, and/or bringing the boards into contact with the treatment liquid using suitable nozzles such as spray or surge nozzles. The printed circuit boards can be held in a horizontal or vertical position or at any other angle.

The following examples serve to further clarify the invention:

EXAMPLE 1

A first and second aqueous solution were created by mixing the following components;

| First solution: | |
| --- | --- |
| Sulfuric acid, 96 weight percent | 50 ml |
| Hydrogen peroxide, 30 weight percent in water | 40 ml |
| Benzotriazole | 10 g |
| Copper-(II) sulfate pentahydrate | 62 g |
| Deionized water added to | 1 l |
| Second solution: | |
| Sulfuric acid, 96 weight percent | 50 ml |
| 2-aminothiazole | 8.0 g |
| Copper-(II) sulfate pentahydrate | 62 g |
| Deionized water added to | 1 l |

Both solutions were heated to 40° C. A copper film (printed circuit board quality, approx. 25 mm thick) was first dipped for 60 sec. in the first solution and then dipped without intermediate rinsing in the second solution for 60 sec. Then the film was rinsed with warm deionized water (50° C.) and dried with warm air.

The copper film was light brown after being treated.

The copper film was then laminated to a prepreg (with fiberglass-reinforced epoxide resin film (FR4 resin), type 2125 MT, 0.1 mm thick by Dielektra, Germany) by pressing the copper and prepreg films together at 175° C. at a pressure of $2.5 \times 10^6$ Pa (25 Bar).

The peel strength of the copper film on the prepreg film was measured. A peel strength of 10.7–11.0 N/cm was determined.

EXAMPLE 2

A first and second aqueous solution were created by mixing the following components:

| First solution: | |
| --- | --- |
| Sulfuric acid, 96 weight percent | 50 ml |
| Hydrogen peroxide, 30 weight percent in water | 40 ml |
| Benzotriazole | 10 g |
| Copper-(II) sulfate pentahydrate | 62 g |
| Deionized water added to | 1 l |
| Second solution: | |
| Sulfuric acid, 96 weight percent | 50 ml |
| 2-aminothiazole | 8.0 g |
| Benzotriazole | 10 g |
| Copper-(II) sulfate pentahydrate | 12 g |
| Deionized water added to | 1 l |

Both solutions were heated to 40° C. A copper film (printed circuit board quality, approx. 25 mm thick) was first dipped for 60 sec. in the first solution, then rinsed with deionized water and subsequently dipped for 60 sec. in the second solution. The film was rinsed with warm, deionized water (50° C.) and dried with warm air.

The copper film was light brown after being treated.

Then the film was pressed together with a prepreg (same conditions as in Example 1), and the peel strength of the bond was measured. An peel strength of 9.8–10.1 N/cm was measured.

All disclosed features and combinations of disclosed features are the subject of this invention to the extent that they are not expressly described as being prior art.

What is claimed is:

1. A process to pretreat copper surfaces so that a tight bond can be subsequently formed between the copper surfaces and plastic substrates by contacting the copper surfaces with a first solution containing:
   a. Hydrogen peroxide,
   b. At least one acid, and
   c. At least one nitrogen-containing, five-member heterocyclic compound that does not contain sulfur, selenium or tellurium atoms in the heterocycle, characterzed in that:

The copper surfaces are brought into contact with a second solution containing:
d. At least one adhesion-promoting compound from the group, consisting of sulfinic acid, selenic acid, telluric acid, heterocyclic compounds that contain at least one sulfur, selenium and/or tellurium atom in the heterocycle, as well as sulfonium, selenonium and telluronium salts, where the sulfenium, selenonium and telluronuim salts are compounds of general formula A:

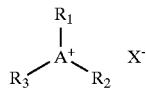

where A=, Se or Te, $R_1$, $R_2$ and $R_3$=alkyl, substituted alkyl, alkenyl, phenyl, substituted phenyl benzyl, cycloalkyl, substituted cycloalkyl, where $R_1$, $R_2$ and $R_3$ are the same or different, and X-=Anion of an inorganic or organic acid or hydroxide.

2. The process according to claim 1, characterized in that sulfinic acids are used as the adhesion-promoting compounds which are from the group consisting of aromatic sulfinic acids and compounds of chemical formula B:

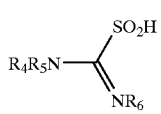

with $R_4$, $R_5$ and $R_6$=hydrogen, alkyl, substituted alkyl, phenyl, substituted phenyl, $R_1$—(CO)— with $R_7$=hydrogen, alkyl, substituted alkyl, phenyl or substituted phenyl, where $R_2$, $R_5$ and $R_6$ are the same or different.

3. The process according to one of the preceding claims, characterized in that formamidine sulfinic acid is selected as the adhesion-promoting compound.

4. The process according to any one of claims 1 and 2, characterized in that aromatic sulfinic acids from the group, consisting of benzene sulfinic acid, toluene sulfinic acids, chlorobenzene sulfinic acids, nitrobenzene sulfinic acids and carboxybenzene sulfinic acids are selected as the adhesion-promoting compounds.

5. The process according to one of the proceeding claims 1–2 characterized in that at least one heterocyclic compound from the group consisting of thiophenes, thiazoles, isothiazoles, thiadiazoles and thiatriazoles are selected as the adhesion-promoting compound.

6. The process according to claim 5, characterzed in that at least one thiophene is selected as the adhesion promoting compound from the group consisting of compounds with chemical formula C:

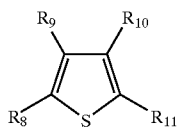

with $R_8$, $R_9$, $R_{10}$, $R_{11}$=hydrogen, alkyl, substituted alkyl, phenyl, substituted phenyl, halogen, amino, alkylamino, dialkylamino, hydroxy, alkoxy, carboxy, carboxyalkyl, alkoxycarbonyl, aminocarbonyl, $R_{12}$—CONH— with $R_{12}$= hydrogen, alkyl, substituted alkyl, phenyl or substituted phenyl, where $R_8$, $R_9$, $R_{10}$ and $R_{11}$ are the same or different and can be part of homo or heterocyclic rings condensed to the thiophene ring.

7. The process according to claim 5, characterized in that at least one thiophene from the group consisting of aminothiophene carboxylic acids, their esters and their amides are selected as the adhesion-promoting compound.

8. The process according to claim 5, characterized in that at least one thiazole is selected as the adhesion-promoting compound consisting of compounds with chemical formula D:

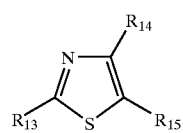

with $R_{13}$, $R_{14}$, $R_{15}$=hydrogen, alkyl, substituted alkyl, phenyl, substituted phenyl, halogen, amino, alkylamino, dialkylamino, hydroxy, alkoxy, carboxy, carboxyalkyl, alkoxycarbonyl, aminocarbonyl, $R_{14}$—CONH— with $R_{16}$= hydrogen, alkyl, substituted alkyl, phenyl or substituted phenyl, where $R_{13}$, $R_{14}$ and $R_{15}$ are the same or different and can be part of a homo or heterocyclic ring condensed to the thiazole ring.

9. The process according to claim 5, characterized in that at least one thiazole from the group consisting of aminothiazole and substituted aminothiazoles is selected as the adhesion-promoting compound.

10. The process according to claim 5, characterized in that at last one thiadiazole from the group consisting of aminothiadiazole and substituted aminothiadiazoles is selected as the adhesion-promoting compound.

11. The process according to claim 1–2, characterized in that at least one sulfonium salt from the group consisting of trimethylsulfonium salts, triphenylsulfonium salts, methionine alkyl sulfonium salts and methionine benzyl sulfonium salts is selected as the adhesion-promoting compound.

12. The process according to claims 1–2, characterized in that at least one compound from the group consisting of triazoles, tetrazoles, imidazoles, pyrazoles and purines is selected as the nitrogen-containing, fivemember heterocyclic compound.

13. The process according to claim 12, characterized in that at least one triazole with the chemical formula E1:

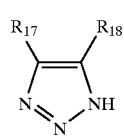

with $R_{17}$, $R_{18}$=hydrogen, alkyl, substituted alkyl, amino, phenyl, substituted phenyl, carboxyalkyl, where $R_{17}$ and $R_{18}$ are the same or different and can be part of a homo or heterocyclic ring condensed to the triazole ring, is selected as the nitrogen-containing, five-member heterocyclic compound.

14. The process according to claim 12, characterized in that at least one triazole from the group consisting of benzotriazole, methylbenizotriazole, ethylbenzotriazole and dimethylbenzotriazole is selected as the nitrogen-containing, five-member heterocyclic compound.

15. The process according to claim 12, characterized in that at least one tetrazole is selected as the nitrogen-containing, five-member heterocyclic compound with the chemical formula E2:

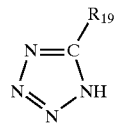

E2 with $R_{19}$=hydrogen, alkyl, substituted alkyl, halogenalkyl, amino, phenyl, substituted phenyl, benzyl, carboxy, carboxyalkyl, alkoxycarbonyl, aminocarbonyl or $R_{20}$—CONH with $R_{20}$=hydrogen, alkyl, substituted alkyl, phenyl or substituted phenyl.

16. The process according to claim 12, characterized in that at least one tetrazole from the group consisting of 5-aminotetrazole, and 5-phenyltetrazole is selected as the nitrogen-containing, five-member heterocyclic compound.

17. The process according to claims 1–2, characterized in that sulfuric acid is selected to be the acid for component b in the first solution.

18. The process of any one of claims 1 to 2, wherein the copper surfaces are surfaces of copper-coated inner surfaces of printed circuit boards.

19. The process of any one of claims 1 to 2, wherein the copper surfaces are surfaces of copper-coated printed circuit boards.

* * * * *